United States Patent
Horikawa

(10) Patent No.: US 11,497,113 B2
(45) Date of Patent: Nov. 8, 2022

(54) ELECTRONIC CIRCUIT AND CIRCUIT BOARD

(71) Applicant: FUJIFILM Business Innovation Corp., Tokyo (JP)

(72) Inventor: Daisuke Horikawa, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 0 days.

(21) Appl. No.: 17/386,548

(22) Filed: Jul. 28, 2021

(65) Prior Publication Data
US 2022/0312582 A1    Sep. 29, 2022

(30) Foreign Application Priority Data
Mar. 24, 2021    (JP) .............................. JP2021-049368

(51) Int. Cl.
| H01P 1/20 | (2006.01) |
| H05K 1/02 | (2006.01) |
| H05K 1/16 | (2006.01) |

(52) U.S. Cl.
CPC .......... *H05K 1/0236* (2013.01); *H01P 1/2005* (2013.01); *H05K 1/0278* (2013.01); *H05K 1/0298* (2013.01); *H05K 1/16* (2013.01)

(58) Field of Classification Search
CPC ...... H05K 1/0236; H05K 1/16; H01P 1/2005; H01P 1/203; H01P 1/2013
See application file for complete search history.

(56) References Cited

U.S. PATENT DOCUMENTS

| 10,128,552 B2 | 11/2018 | Morita et al. |
| 2015/0054713 A1* | 2/2015 | Takasaki .............. H05K 1/0236 |
| | | 343/909 |

FOREIGN PATENT DOCUMENTS

| JP | 2013255259 | 12/2013 |
| JP | 2016134809 | 7/2016 |

* cited by examiner

*Primary Examiner* — Jeremy C Norris
(74) *Attorney, Agent, or Firm* — JCIPRNET

(57) ABSTRACT

An electronic circuit includes plural individual electronic circuits arranged, in which each of the plural individual electronic circuits has a first conductor column that is connected to a ground of a first layer which is any one of plural conductor layers sequentially stacked in a separated state and extends in a stacking direction, a conductor line that is connected to the conductor column to extend in a band shape in a second layer different from the first layer which is any one of the plural conductor layers, and of which an end portion separated from the conductor column is an open end, and a second conductor column that is connected to the conductor line, is not connected to the ground, and extends in the stacking direction, and each of a first individual electronic circuit and a second individual electronic circuit adjacent to each other among the plural individual electronic circuits has at least a pair of the second conductor columns, which are formed at adjacent positions without interposing any one of the conductor lines of the first individual electronic circuit and the second individual electronic circuit between the pair of the second conductor columns.

5 Claims, 7 Drawing Sheets

ELECTRONIC CIRCUIT AND CIRCUIT BOARD

CROSS-REFERENCE TO RELATED APPLICATIONS

This application is based on and claims priority under 35 USC 119 from Japanese Patent Application No. 2021-049368 filed Mar. 24, 2021.

BACKGROUND

(i) Technical Field

The present invention relates to an electronic circuit and a circuit board.

(ii) Related Art

A technique of suppressing propagation of electromagnetic wave noise by an electromagnetic band gap (EBG) structure formed on a circuit board is known. Since the EBG structure requires a large area on a circuit board and a plurality of identical structures are arranged, miniaturization thereof is one of the problems.

For example, JP2016-134809A proposes an EBG structure in which two layers of a spiral-shaped conductor line are formed and connected with a via to achieve the miniaturization.

JP2013-255259A proposes an EBG structure in which a third layer, in addition to a layer on which a conductor line is formed and a ground layer, is formed to achieve the miniaturization.

SUMMARY

Aspects of non-limiting embodiments of the present disclosure relate to an electronic circuit and a circuit board that use an interaction between structures arranged adjacent to each other to achieve miniaturization.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided an electronic circuit including a plurality of individual electronic circuits arranged, in which each of the plurality of individual electronic circuits has a first conductor column that is connected to a ground of a first layer which is any one of a plurality of stacked conductor layers and extends in a stacking direction, a conductor line that is connected to the conductor column to extend in a band shape in a second layer different from the first layer which is any one of the plurality of conductor layers, and of which an end portion separated from the conductor column is an open end, and a second conductor column that is connected to the conductor line, is not connected to the ground, and extends in the stacking direction, and each of a first individual electronic circuit and a second individual electronic circuit adjacent to each other among the plurality of individual electronic circuits has at least a pair of the second conductor columns, which are formed at adjacent positions without interposing any one of the conductor lines of the first individual electronic circuit and the second individual electronic circuit between the pair of the second conductor columns.

BRIEF DESCRIPTION OF THE DRAWINGS

Exemplary embodiment(s) of the present invention will be described in detail based on the following figures, wherein.

DETAILED DESCRIPTION

First, an electromagnetic band gap (EBG) structure will be described. The EBG structure is a periodic structure having a frequency band (Band Gap) in which propagation of an electromagnetic wave is suppressed. With forming of the EBG structure near an electronic circuit that emits electromagnetic wave noise on a circuit board, the propagation of the electromagnetic wave noise emitted from the electronic circuit is suppressed.

Figure 1:
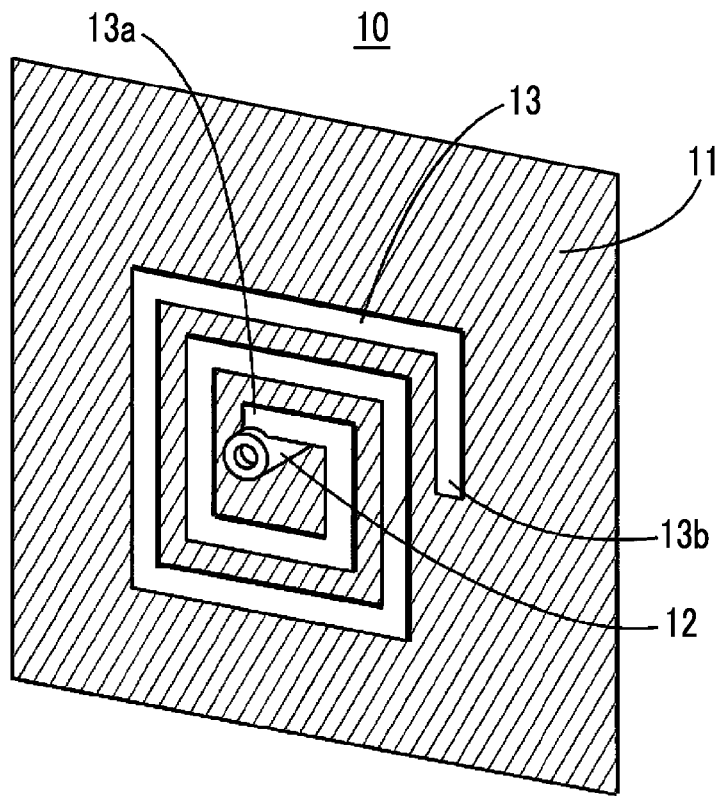
FIG. 1 is a schematic view of an example of a circuit for one unit constituting an EBG structure in the related art.

FIG. 1 is a schematic view of an example of a circuit for one unit constituting an EBG structure in the related art.

A circuit board having a plurality of conductor layers is employed, and a first layer which is any one of the plurality of layers is a ground 11. A conductor column referred to as a via 12, which is connected to the ground 11 which is the first layer and extends in a stacking direction, is formed. A conductor line referred to as a stub 13, which extends in a spiral shape in a second layer different from the first layer is formed. One end 13a of the stub 13 is connected to the via 12. An end portion 13b of the stub 13 separated from the via 12 is an open end, that is, an open end that is not directly connected to another conductor. The EBG structure is formed by arranging a plurality of unit structures as shown in FIG. 1 on the circuit board.

The stub 13 shown in FIG. 1 is a conductor line that does not have the spiral shape composed of a curved line, but extends from one end portion connected to the via 12 toward the other end portion while intermittently bending in the same rotation direction. Specifically, the stub 13 is a conductor line extending while intermittently bending by 90° in the same rotation direction. Not only the spiral shape composed of a continuous curve but also the shape extending while intermittently bending, for example, by 45° or 90°, is referred to as the spiral shape.

Figure 2:
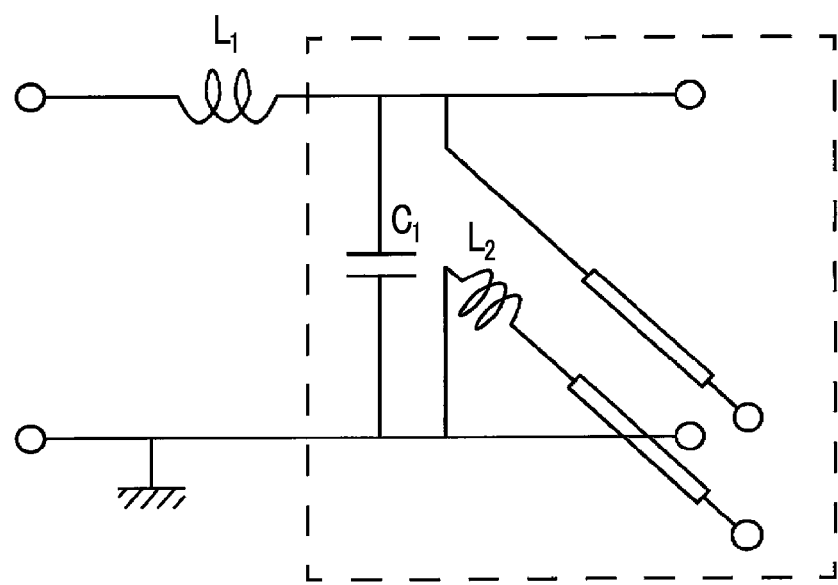
FIG. 2 is a distributed constant circuit which is an equivalent circuit of the EBG structure.

FIG. 2 is a view of a distributed constant circuit which is an equivalent circuit of the EBG structure.

The equivalent circuit of the EBG structure is expressed as the distributed constant circuit shown in FIG. 2. An inductance L1 and a capacitance C1 are respectively inductance and capacitance of a transmission line. The inductance L1 among the above has little relationship to frequency characteristics that suppress an electromagnetic wave noise radio wave, and a portion surrounded by a broken line is related to the frequency characteristics. Admittance Y in the portion surrounded by the broken line is represented by the following equation.

$$Y = j\omega C_1 + \frac{1}{Z_{stub} + j\omega L_2} \quad (1)$$

Here,
Zstub is impedance of stub 13,
C1 is capacitance between adjacent unit structures,
L2 is inductance of via 12,
ω is angular frequency, and
j is complex symbol.

Figure 3:
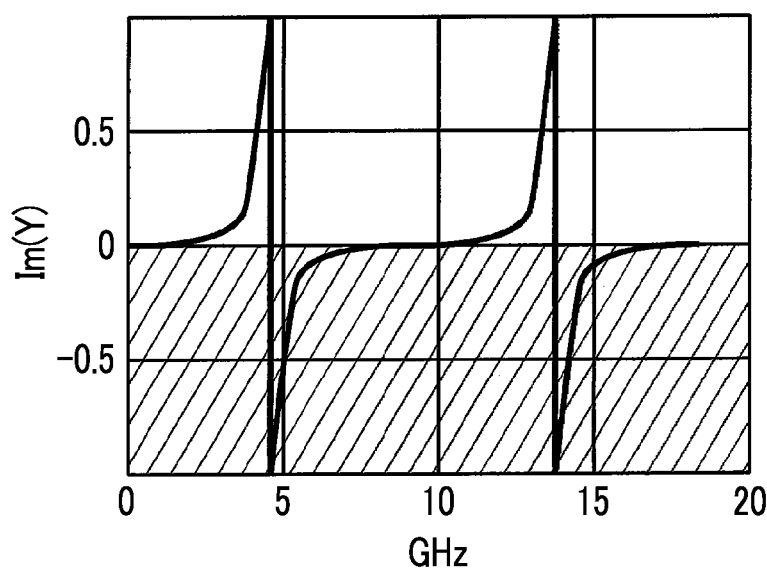
FIG. 3 is a graph showing frequency characteristics of admittance Y.

FIG. 3 is a graph showing the frequency characteristics of the admittance Y. The vertical axis of FIG. 3 is an imaginary component Im (Y) of the admittance Y, and the horizontal axis is a frequency (GHz).

A region where Im (Y) is negative, which is shown with hatching in FIG. 3, is referred to as an inductance region, and a region where Im (Y) is positive is referred to as a capacitance region. In this EBG structure, the propagation of the electromagnetic wave noise at a frequency within the inductance region, that is, the frequency region where Im (Y) is negative is suppressed.

The frequency region in which Im (Y) is negative is related to a length of the stub 13. A pattern of the frequency characteristics shifts to a low frequency side as the length of the stub 13 is longer, and the pattern of the frequency characteristics shifts to a high frequency side as the length of the stub 13 is shorter.

Figure 4:
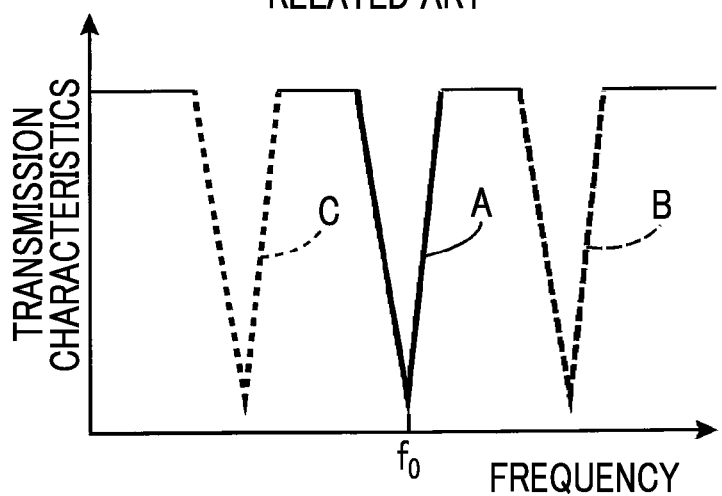
FIG. 4 is a graph schematically showing transmission characteristics with respect to frequency.

FIG. 4 is a graph schematically showing transmission characteristics with respect to frequency. In FIG. 4, the noise propagation is suppressed as the transmission characteristics are lowered.

A center frequency f0 at which the noise propagation is suppressed is generally represented by the following equation.

$$f0 = c/(4 \times \text{length of stub}) \quad (2)$$

In FIG. 4, with a graph A as a reference, a frequency at which the noise propagation is suppressed is shifted to a high frequency side as shown in a graph B in a case where a short stub is used, and the frequency at which the noise propagation is suppressed is shifted to a low frequency side as shown in a graph C in a case where a long stub is used. This means that the long stub is required to suppress the propagation of low-frequency noise and a large area is required. Therefore, miniaturization of the EBG structure is required.

Figure 5A:
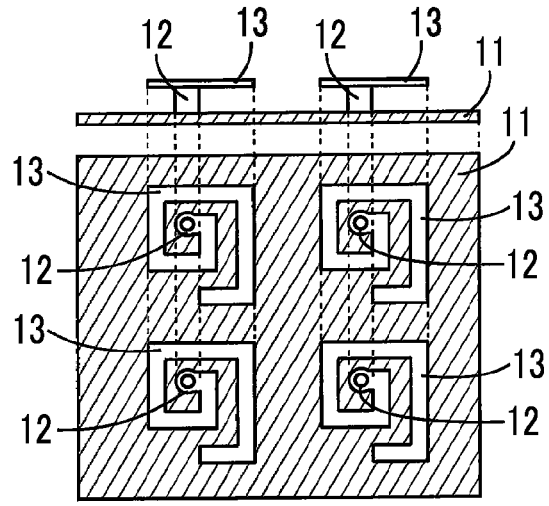
FIGS. 5A to 5C are schematic views of EBG structures of various shapes.
Figure 5B:
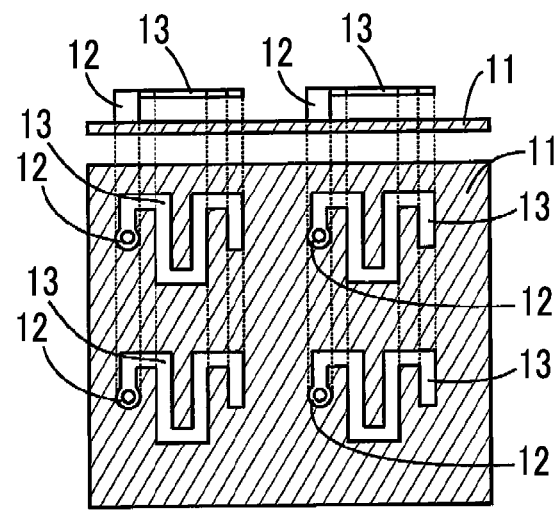
Figure 5C:
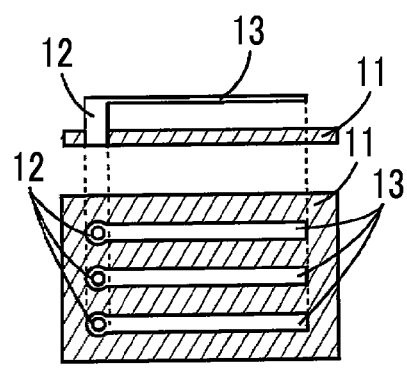

FIGS. 5A to 5C are schematic views of EBG structures of various shapes.

FIG. 5A shows an EBG structure in which a plurality of units having spiral-shaped stubs 13 described above are arranged. Similar to FIG. 1, the stub 13 shown here is a conductor line that extends from the one end portion connected to the via 12 toward the other end portion while intermittently bending by 90° in the same rotation direction. The EBG structure is formed by any spiral shape having the spiral shape in the above definition.

FIG. 5B shows an EBG structure in which a plurality of units having so-called meander-shaped stubs 13 extending while reciprocating left and right are arranged. FIG. 5B shows a meander shape whose extending direction is reversed by bending twice by 90° in the same rotation direction, but the shape of the stub 13 is not limited thereto. For example, the shape thereof may be a shape whose extending direction is reversed while drawing a curve or a shape whose extending direction is reversed by bending four times by 45°. One end 13a of the stub 13 of each unit is connected to the via 12 of each unit. Each stub 13 extends in the meander shape, and the end portion 13b on a side separated from the via 12 is the open end.

FIG. 5C shows an EBG structure in which a plurality of units having stubs 13 extending linearly are arranged. One end 13a of the stub 13 of each unit is connected to the via 12 of each unit. Each stub 13 extends in a linear shape, and the end portion 13b on the side separated from the via 12 is the open end.

As illustrated in FIGS. 4A to 4C, the stubs 13 having various shapes can be employed for the EBG structure. However, the length of the stub 13 from a location connected to the via 12 to the open end is related to a frequency of noise that suppresses the propagation, and a long stub is required to suppress low-frequency noise. Therefore, in order to suppress the low-frequency noise, forming of the stub 13 connected to the via 12 at the one end 13a thereof is favorable in terms of the miniaturization.

Based on the above description of the EBG structure, exemplary embodiments of the present invention will be described below.

Figure 6:
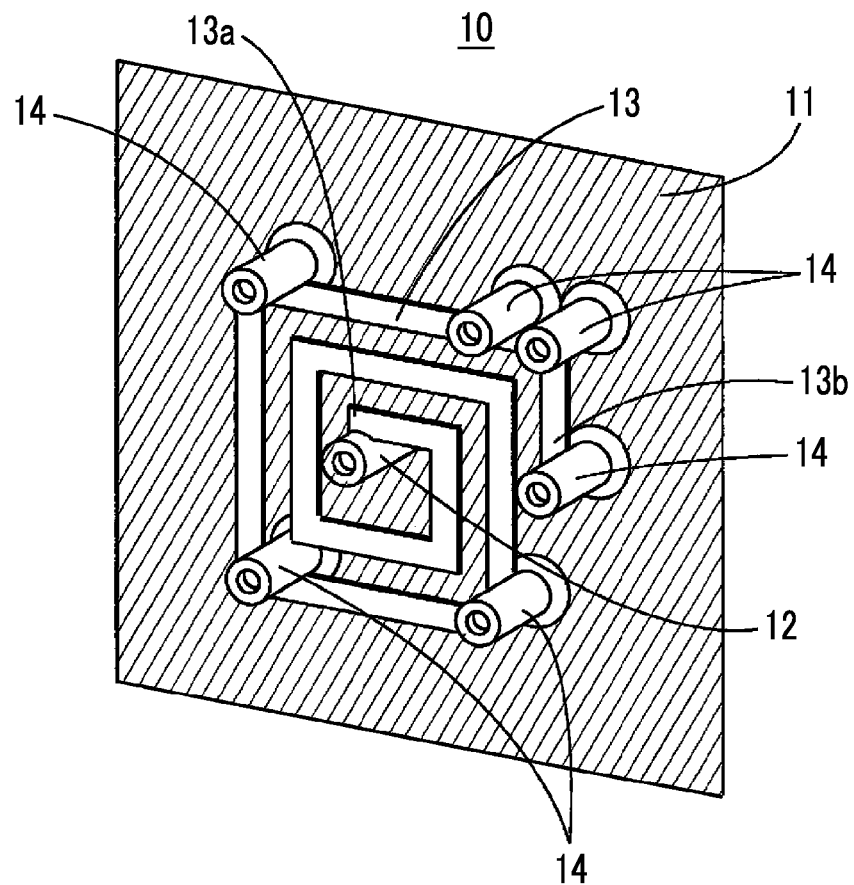
FIG. 6 is a view of a circuit for one unit of an EBG structure constituting an electronic circuit as a first exemplary embodiment of the present invention.

FIG. 6 is a view of a circuit for one unit of an EBG structure constituting an electronic circuit as a first exemplary embodiment of the present invention.

Figure 7:
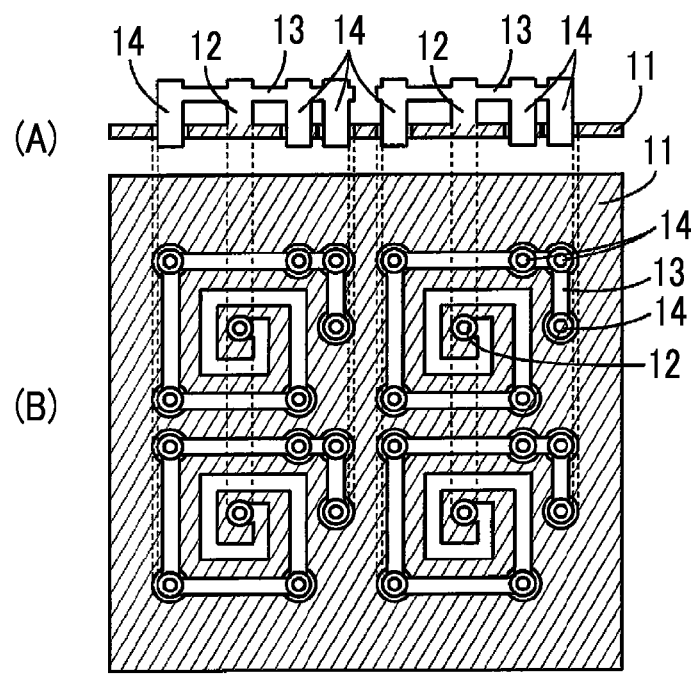
FIG. 7 is schematic view of an EBG structure in which four circuits for one unit shown in FIG. 6 are arranged.

FIG. 7 is schematic view of an EBG structure in which four circuits for one unit shown in FIG. 6 are arranged. A part (A) in FIG. 7 is a schematic cross-sectional view, and a part (B) in FIG. 7 is a schematic plan view.

As in the example in the related art shown in FIG. 1, a circuit board 10 having a plurality of conductor layers is employed, and a first layer which is any one of the plurality of layers is the ground 11. A conductor column referred to as a via 12, which is connected to the ground 11 which is the first layer and extends in a stacking direction, is formed. A conductor line referred to as a stub 13, which extends in a spiral shape in a second layer different from the first layer is formed. In the present exemplary embodiment, a spiral shape extending while changing the direction by 90° is employed as the conductor line. However, the conductor line is not limited to the spiral shape extending while changing the direction by 90°. As defined above, the conductor line extending from the one end portion toward the other end portion while continuously or intermittently bending in the same rotation direction may be employed.

In the circuit for one unit shown in FIG. 6, vias 14 connected to the stub 13 and extending in a stacking direction are provided at a plurality of locations during the extension of the stub 13. However, the vias 14 are not connected to the ground 11 unlike the vias 12 at the center of the spiral, as shown in the part (A) in FIG. 7. The via 12, at the center of the spiral and connected to both the stub 13 and the ground 11, corresponds to an example of a first conductor column referred to in the present invention. The via 14, connected to the other stub 13 and unconnected to the ground 11, corresponds to an example of a second conductor column referred to in the present invention.

The vias 14, unconnected to the ground 11, are disposed at positions adjacent to each other without interposing the conductor lines of the stubs 13 in a case where the plurality of unit circuits are arranged, as shown in the part (B) in FIG. 7. However, since the unit circuits having the same shape are arranged here, the unit circuit disposed in a corner does not have a unit circuit next to the unit circuit. Therefore, a via 14 having no partner to be paired with is also present. The vias 14 adjacent to each other of two adjacent unit circuits act as a capacitor, and the capacitance is generated there. In a case where two vias 14 are separated to the extent that the conductor line of the stub 13 is disposed between the vias, sufficient capacitance cannot be generated. Therefore, for example, the two vias 14 are favorably close to each other to the extent that the conductor line of the stub 13 is not disposed between the vias.

Figure 8:
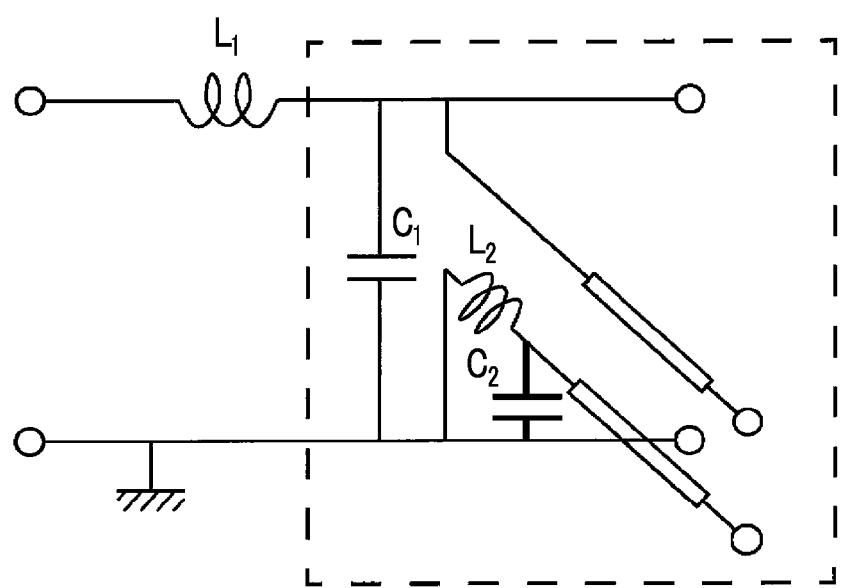
FIG. 8 is a view of a distributed constant circuit which is an equivalent circuit of the EBG structure in a case where a via acting as a capacitor is added.

FIG. 8 is a view of a distributed constant circuit which is an equivalent circuit of the EBG structure in a case where a via acting as a capacitor is added.

In FIG. 8, a capacitor C2 is added as compared with the distributed constant circuit which is the equivalent circuit of the EBG structure in the related art shown in FIG. 2.

Admittance Y in a portion surrounded by the broken line of the equivalent circuit is represented by the following equation.

$$Y = j\omega C_1 + \cfrac{1}{(Z_{stub} + j\omega L_2) // \left(\cfrac{1}{j\omega C_2}\right)} \quad (3)$$

$$= j\omega C_1 + \cfrac{1 + j\omega C_2(Z_{stub} + j\omega L_2)}{(Z_{stub} + j\omega L_2)}$$

Note that, // represents parallel connect-ion.

Figure 9A:
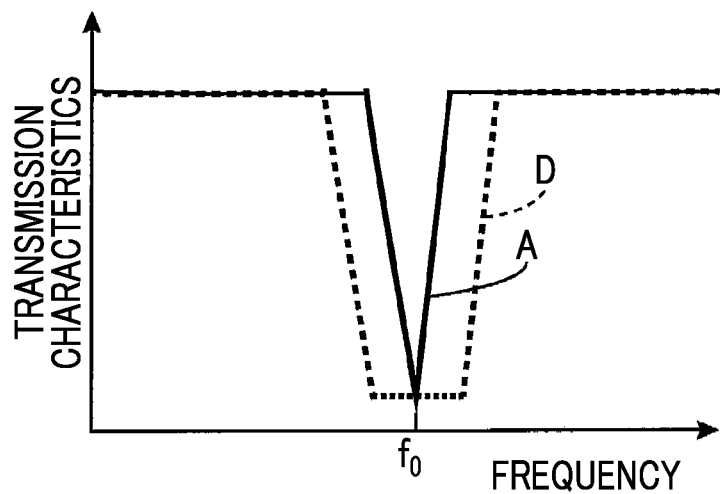
FIGS. 9A and 9B are views for describing an effect of adding a pair of vias adjacent to each other between unit circuits adjacent to each other.
Figure 9B:
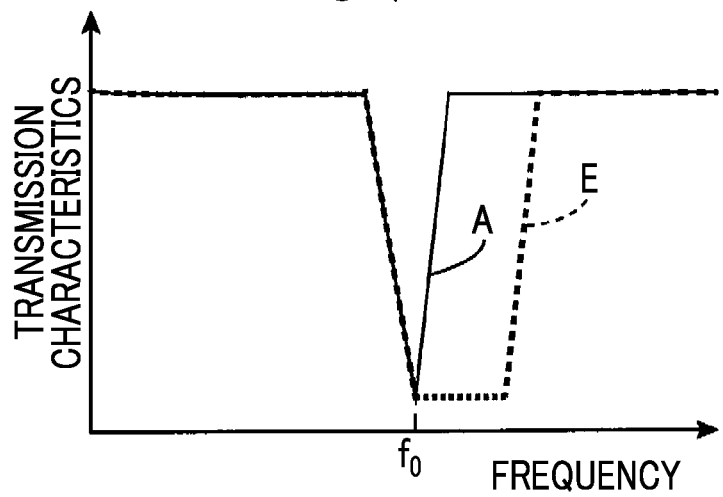

FIGS. 9A and 9B are views for describing an effect of adding a pair of vias adjacent to each other between unit circuits adjacent to each other. The horizontal axis of FIGS. 9A and 9B represents the frequency, and the vertical axis thereof represents the transmission characteristics. The noise propagation is hindered as the transmission characteristics are lowered.

With an imaginary part Im (Y) of the admittance Y represented by the above equation (1), which is calculated from the equivalent circuit of the EBG structure in the related art, the transmission characteristics are represented as shown in a graph A of FIG. 9A, for example. Here, an effort is made to prevent the propagation of noise at the center frequency f0.

With an imaginary part Im (Y) of the admittance Y represented by the above equation (3) in a case where the vias 14 adjacent to each other are formed in the adjacent unit circuits, the transmission characteristics are represented as shown in a graph D of FIG. 9A, for example. That is, the frequency band in which the noise propagation can be prevented is widened.

The miniaturization of the EBG structure after forming the via 14 to widen the frequency band is considered. In a case where the miniaturization is achieved, the frequency band in which the noise propagation can be prevented shifts to the high frequency side, as shown in a graph E of FIG. 9B. Here, an effort is made to prevent the propagation of the noise at the center frequency f0. Therefore, even though the frequency band is shifted to the high frequency side to the extent capable of being represented by the graph E, the performance of preventing the propagation of the noise at the center frequency f0 is maintained. In other words, with forming of the via 14, the miniaturization of the EBG structure can be achieved while maintaining the performance of preventing the propagation of the noise at the center frequency f0.

As an example, in a case where the EBG structure having the shapes shown in FIGS. 6 and 7 is employed, the fact that the area of the EBG structure can be reduced by 20% or more is confirmed.

In arranging the plurality of unit circuits, a goal is to arrange exactly identical unit circuits. However, as long as a line width of the stub 13 and the length of the stub are respectively within ±60% and ±15%, an object of preventing the propagation of at least one noise at the center frequency f0 common to each other can be achieved.

FIGS. 10A to 10D are plan views of EBG structures of various exemplary embodiments.

Figure 10A:
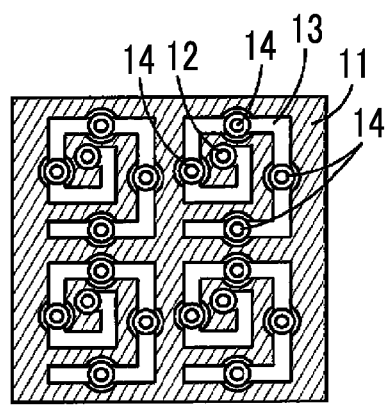
FIGS. 10A to 10D are plan views of EBG structures of various exemplary embodiments.

FIG. 10A shows an example of an EBG structure having the spiral-shaped conductor line. In this example, the vias 14, unconnected to the ground 11, are disposed at four locations on the top, bottom, left, and right for each unit circuit.

Figure 10B:
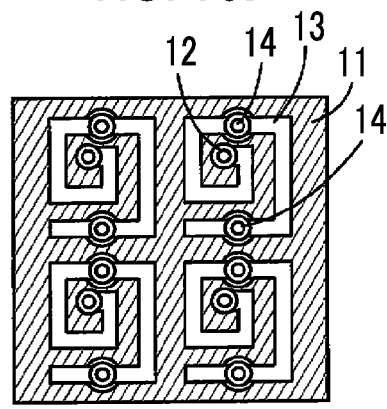

FIG. 10B shows another example of an EBG structure having the spiral-shaped conductor line. In this example, the vias 14, unconnected to the ground 11, are disposed at two locations on the top and bottom for each unit circuit.

As shown in the examples, there is no limit to the number of vias 14.

Figure 10C:
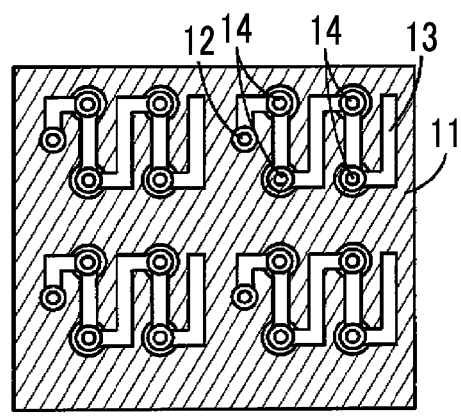

FIG. 10C shows an example of an EBG structure having a meander-shaped stub 13. In FIG. 10C, two vias 14 are formed on each of the top and bottom for each unit circuit such that two unit circuits on the top and bottom are adjacent to each other.

Figure 10D:
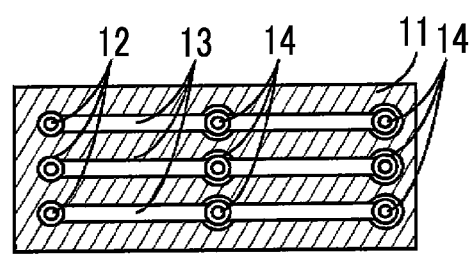

FIG. 10D shows an example of an EBG structure having a linear-shaped stub 13. In FIG. 10D, the vias 14 are formed at two locations of a central position and an open end for each unit circuit such that two unit circuits on the top and bottom are adjacent to each other.

As shown in the examples, the present invention can be employed regardless of the shape of the stub 13.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An electronic circuit comprising:
   a plurality of individual electronic circuits arranged,
   wherein each of the plurality of individual electronic circuits has a first conductor column that is connected to a ground of a first layer which is any one of a plurality of conductor layers sequentially stacked in a separated state and extends in a stacking direction, a conductor line that is connected to the conductor column to extend in a band shape in a second layer different from the first layer which is any one of the plurality of conductor layers, and of which an end portion separated from the conductor column is an open end, and a second conductor column that is connected to the conductor line, is not connected to the ground, and extends in the stacking direction, and each of a first individual electronic circuit and a second individual electronic circuit adjacent to each other among the plurality of individual electronic circuits has at least a pair of the second conductor columns, which are formed at adjacent positions without interposing any one of the conductor lines of the first individual electronic circuit and the second individual electronic circuit between the pair of the second conductor columns.

2. The electronic circuit according to claim 1, wherein the plurality of individual electronic circuits are circuits that suppress at least one electromagnetic wave noise having the same frequency.

3. The electronic circuit according to claim 2, wherein the conductor line of each of the plurality of individual electronic circuits is a line of which an end portion different from the open end of the conductor line is connected to the conductor column.

4. The electronic circuit according to claim 3, wherein the conductor line is a line extending from one end portion toward the other end portion while continuously or intermittently bending in the same rotation direction.

5. A circuit board comprising:
the electronic circuit according to claim 1.

* * * * *